United States Patent
Shibata et al.

(10) Patent No.: US 9,680,001 B2
(45) Date of Patent: Jun. 13, 2017

(54) NITRIDE SEMICONDUCTOR DEVICE (71) Applicant: Panasonic Intellectual Property Management Co., Ltd., Osaka (JP)

(72) Inventors: Daisuke Shibata, Kyoto (JP); Noboru Negoro, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/788,791

(22) Filed: Jul. 1, 2015

(65) Prior Publication Data
US 2015/0303292 A1   Oct. 22, 2015

Related U.S. Application Data (63) Continuation of application No. PCT/JP2013/006370, filed on Oct. 29, 2013.

(30) Foreign Application Priority Data

Jan. 8, 2013   (JP) .................................. 2013-001310

(51) Int. Cl.
*H01L 29/778* (2006.01)
*H01L 29/423* (2006.01)
(Continued)

(52) U.S. Cl.
CPC ...... *H01L 29/7787* (2013.01); *H01L 29/0684* (2013.01); *H01L 29/1029* (2013.01);
(Continued)

(58) Field of Classification Search
CPC ........... H01L 29/1066; H01L 29/66212; H01L 29/1033; H01L 29/0684; H01L 29/872;
(Continued)

(56) References Cited

U.S. PATENT DOCUMENTS

2009/0114948 A1*  5/2009  Ishida ............... H01L 29/872
                                                    257/183
2011/0227093 A1*  9/2011  Hikita ............... H01L 29/808
                                                    257/76

(Continued)

FOREIGN PATENT DOCUMENTS

JP   2007-134607   5/2007
JP   2009-117485   5/2009
(Continued)

OTHER PUBLICATIONS

International Search Report of PCT application No. PCT/JP2013/006370 dated Nov. 26, 2013.

*Primary Examiner* — Eric Ward
(74) *Attorney, Agent, or Firm* — McDermott Will & Emery LLP (57) ABSTRACT

A nitride semiconductor device includes: a substrate; a buffer layer formed on the substrate; a laminated body formed by two or more cycles of semiconductor layers each including a first nitride semiconductor layer, and a second nitride semiconductor layer having a larger band gap than a band gap of the first nitride semiconductor layer, the first and second nitride semiconductor layers being laminated in this order on the buffer layer; a first electrode; and a second electrode. A channel layer is formed in each of the semiconductor layers at an interface between the first nitride semiconductor layer and the second nitride semiconductor layer. A carrier concentration of the channel layer in the uppermost semiconductor layer is lower than a carrier concentration of each of the channel layers of the other semiconductor layers.

9 Claims, 11 Drawing Sheets (51) Int. Cl.
*H01L 29/66* (2006.01)
*H01L 29/10* (2006.01)
*H01L 29/20* (2006.01)
*H01L 29/205* (2006.01)
*H01L 29/06* (2006.01)
*H01L 29/872* (2006.01)
*H01L 29/417* (2006.01)

(52) U.S. Cl.
CPC ...... *H01L 29/1033* (2013.01); *H01L 29/1066* (2013.01); *H01L 29/2003* (2013.01); *H01L 29/205* (2013.01); *H01L 29/42316* (2013.01); *H01L 29/66212* (2013.01); *H01L 29/66462* (2013.01); *H01L 29/7783* (2013.01); *H01L 29/872* (2013.01); *H01L 29/41766* (2013.01)

(58) Field of Classification Search
CPC ........... H01L 29/66462; H01L 29/2003; H01L 29/1029; H01L 29/42316; H01L 29/205; H01L 29/41766; H01L 29/778–29/7789
See application file for complete search history.

(56) References Cited

U.S. PATENT DOCUMENTS

| | | | |
|---|---|---|---|
| 2011/0227132 A1* | 9/2011 | Anda | ................ H01L 29/42316 257/192 |
| 2012/0146093 A1* | 6/2012 | Shibata | ............... H01L 29/0619 257/192 |
| 2012/0228626 A1 | 9/2012 | Mochizuki et al. | |

FOREIGN PATENT DOCUMENTS

| | | |
|---|---|---|
| JP | 2011-054845 | 3/2011 |
| JP | 2012-186331 | 9/2012 |
| WO | 2011/010419 | 1/2011 |

\* cited by examiner

NITRIDE SEMICONDUCTOR DEVICE

BACKGROUND OF THE INVENTION

1. Field of the Invention

The present disclosure relates to a nitride semiconductor device applicable to a power device included in a power supply circuit of a television set or other consumer products.

2. Description of the Related Art

A nitride semiconductor, including a GaN semiconductor as a typical example, has a wide gap. For example, GaN and AlN semiconductors have wide band gaps of 3.4 eV and 6.2 eV at room temperature, respectively. Accordingly, a nitride semiconductor is characterized by a higher breakdown electric field, and a higher saturated electron drift velocity than that velocity of a compound semiconductor such as a GaAs semiconductor or of a Si semiconductor. In AlGaN/GaN heterostructure, charges are generated at a heterointerface as a result of spontaneous polarization and piezoelectric polarization on (0001) plane. In this case, a sheet carrier concentration of $1 \times 10^{13}$ cm$^{-2}$ or higher is obtained even in an undoped state. Accordingly, such diode and hetero-junction field effect transistor (HFET) which have higher current density are producible by use of two-dimensional electron gas (2DEG) at a heterointerface. In recent years, therefore, research and development of a power device utilizing a nitride semiconductor have been actively conducted in view of advantages of the nitride semiconductor capable of realizing higher output and higher breakdown voltage.

The "AlGaN" noted herein represents ternary mixed crystal $Al_xGa_{1-x}N$ (x: arbitrary value, 0≤x≤1). Hereinafter, multi-element compounds are expressed simply by the arrangement of chemical symbols such as AlInN, GaInN, etc. For example, nitride semiconductor $Al_xGa_{1-x-y}In_yN$, where 0≤x≤1, 0≤y≤1, and x+y≤1, is expressed simply by AlGaInN.

A Schottky diode is an example of a main device included in GaN power devices. Since this diode uses a channel produced by two-dimensional electron gas generated at an interface between an undoped AlGaN layer and an undoped GaN layer laminated on each other, large-current and low-resistance operation is achievable.

In general, a Schottky diode provides advantages such as an excellent switching behavior, and a low forward threshold voltage. However, a Schottky diode has a disadvantage of large backward leakage current. For overcoming this drawback, a method currently proposed inserts a p-GaN layer into an anode electrode formed on an undoped AlGaN layer, for example, so as to reduce interface leakage current. This method produces a diode capable of reducing leakage current at a low operating voltage.

CITATION LIST

Patent Literature

PTL 1: Unexamined Japanese Patent Publication No. 2011-54845

The conventional method noted above realizes reduction of leakage current at a low operating voltage, but does not provide a sufficient effect for reducing leakage current at a high operating voltage.

SUMMARY OF THE INVENTION

The present disclosure has been developed to solve the aforementioned problem. It is an object of the present disclosure to provide a nitride semiconductor device capable of reducing leakage current even in a high voltage region.

For attaining the above object, a nitride semiconductor device according to an aspect of the invention comprises: a substrate; a buffer layer formed on the substrate; a laminated body formed by two or more cycles of semiconductor layers each including a first nitride semiconductor layer, and a second nitride semiconductor layer having a larger band gap than a band gap of the first nitride semiconductor layer, the first and second nitride semiconductor layers being laminated in this order on the buffer layer; a first electrode formed in a first region that continues from a side surface of the laminated body to an upper surface of the laminated body; and a second electrode formed in a second region corresponding to a part of a region that is not the first region and continues from the side surface of the laminated body to the upper surface of the laminated body. A channel layer is formed in each of the semiconductor layers at an interface between the first nitride semiconductor layer and the second nitride semiconductor layer. A carrier concentration of the channel layer in the uppermost semiconductor layer is lower than a carrier concentration of each of the channel layers of the other semiconductor layers.

This structure includes the laminated body containing the plurality of AlGaN/GaN layers, thereby producing a plurality of channels and allowing reduction of on-resistance. In this case, backward leakage current is controllable in accordance with changes of carrier concentrations of the respective channels. Accordingly, reduction of on-resistance and backward leakage current are both achievable in the nitride semiconductor device.

The nitride semiconductor device further includes a block layer electrically connected with the first electrode, and formed between the first electrode and the upper surface of the laminated body.

This structure inserts a semiconductor layer constituting the block layer into the electrode, thereby further reducing backward leakage current. Accordingly, further reduction of on-resistance and backward leakage current are achievable in the nitride semiconductor device.

The block layer is constituted by p-AlGaN.

This structure inserts p-AlGaN into the electrode, thereby further reducing backward leakage current. Accordingly, reduction of on-resistance and backward leakage current are both achievable in the nitride semiconductor device.

The first nitride semiconductor layer is constituted by GaN. The second nitride semiconductor layer is constituted by AlGaN. An Al composition ratio of AlGaN constituting the uppermost second nitride semiconductor layer is lower than each Al composition ratio of AlGaN constituting the other second nitride semiconductor layers.

This structure allows reduction of a carrier concentration of the uppermost layer side channel, and reduction of backward leakage current via the uppermost AlGaN layer. Accordingly, reduction of on-resistance and backward leakage current are both achievable in the nitride semiconductor device. In addition, reduction of the Al composition of the uppermost undoped AlGaN layer decreases the carrier concentration of the channel. In this case, backward leakage current via the uppermost AlGaN layer also decreases. Accordingly, reduction of on-resistance and backward leakage current are both achievable in the nitride semiconductor device.

A film thickness of the uppermost second nitride semiconductor layer is larger than each film thickness of the other second nitride semiconductor layers.

This structure increases a film thickness of an uppermost AlGaN barrier layer, thereby reducing backward leakage current via the uppermost AlGaN layer. Accordingly, reduction of both on-resistance and backward leakage is achievable.

The nitride semiconductor device described above is a nitride semiconductor diode. According to the nitride semiconductor diode of an aspect of the present disclosure, the first electrode is an anode electrode, and the second electrode is a cathode electrode.

This structure provides a nitride semiconductor diode having the foregoing characteristics. More specifically, this structure provides a nitride semiconductor diode capable of reducing both on-resistance and backward leakage current.

The nitride semiconductor device described above is a nitride semiconductor transistor. According to the nitride semiconductor transistor of an aspect of the present disclosure, the first electrode is a drain electrode. The nitride semiconductor transistor further includes a third electrode disposed on an upper surface of the uppermost layer of the laminated body. The third electrode is a source electrode.

This structure provides a nitride semiconductor transistor having the foregoing characteristics. More specifically, this structure provides a nitride semiconductor transistor capable of reducing both on-resistance and backward leakage current.

The nitride semiconductor device provided by the present disclosure is a nitride semiconductor capable of reducing leakage current even in a high voltage region.

DETAILED DESCRIPTION OF THE PREFERRED EMBODIMENTS

Underlying Knowledge Forming Basis of the Present Disclosure

A technology on which the present disclosure is based is hereinafter touched upon before describing exemplary embodiments of the present disclosure.

As described above, a Schottky diode is one example of a main device included in GaN power devises. For example, a Schottky diode includes a buffer layer having a film thickness of 2 μm, an undoped GaN layer having a film thickness of 3 μm, and an undoped AlGaN layer having a film thickness of 25 nm, all layers of which are laminated in this order on a Si substrate. A Ni anode electrode is formed on the undoped AlGaN layer. A Ti/Al cathode electrode is configured to cover a region etched to penetrate the undoped AlGaN layer and the undoped GaN layer. This type of Schottky diode uses a channel produced by two-dimensional electron gas generated at an interface between the undoped AlGaN layer and the undoped GaN, thereby allowing large current and low resistance operation.

In general, a Schottky diode has advantages such as an excellent switching behavior, and a low forward threshold voltage. However, a Schottky has a disadvantage of large backward leakage current. For overcoming this drawback, the following method has been proposed, for example.

Figure 12:
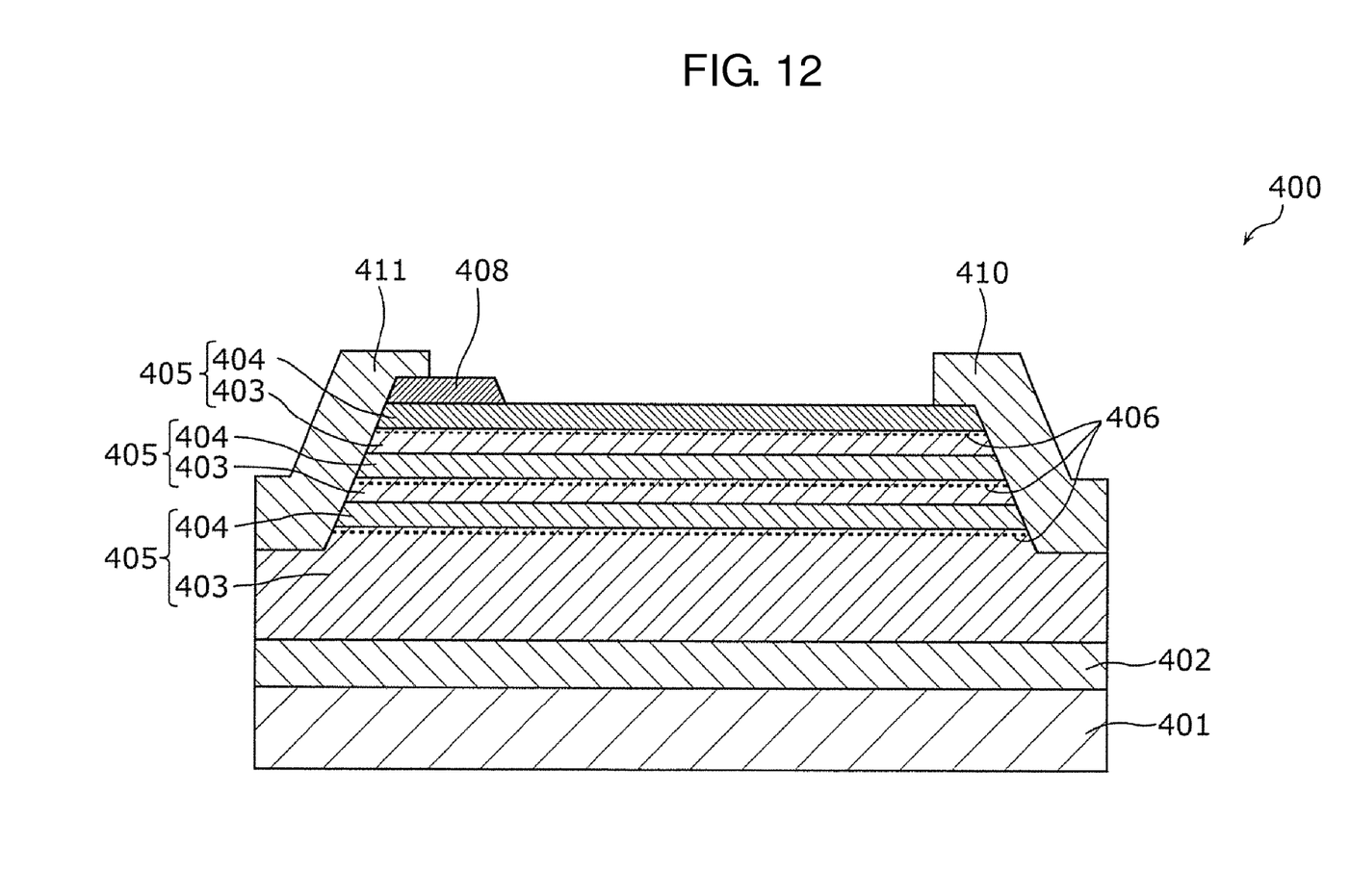
FIG. 12 is a cross-sectional view illustrating a configuration of a nitride semiconductor device according to a technology forming basis of the present disclosure.

FIG. 12 is a cross-sectional view of a Schottky diode including AlGaN/GaN heterostructure. As illustrated in FIG. 12, p-GaN layer 408 corresponding to a block layer is inserted between undoped AlGaN layer 404 and anode electrode 411 to reduce interface leakage current of Schottky diode 400. This structure improves backward characteristics. Concerning forward characteristics, current in Schottky diode 400 shown in FIG. 12 flows through a Schottky junction portion. In this case, a threshold voltage becomes equivalent to a threshold voltage of a Schottky diode. This structure allows reduction of leakage current at a low operating voltage.

While realizing reduction of leakage current at a low operating voltage, this method does not provide a sufficient effect for reducing leakage current at a high operating voltage.

In consideration of this problem, described hereinbelow is a nitride semiconductor device capable of realizing reduction of leakage current even in a high voltage region.

Exemplary embodiments are now detailed with reference to the drawings.

First Exemplary Embodiment

Figure 1:
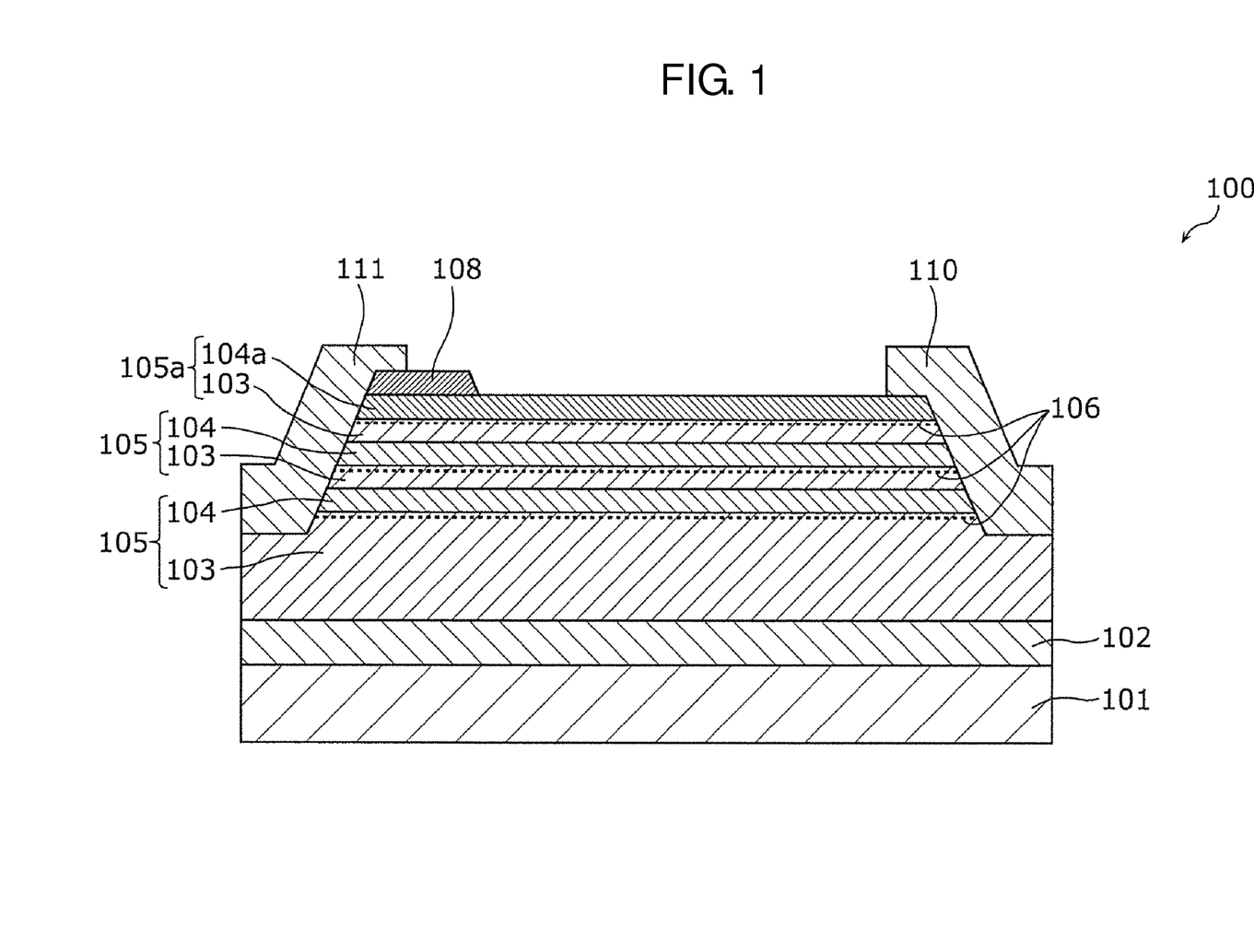
FIG. 1 is a cross-sectional view illustrating a configuration of a nitride semiconductor device according to a first exemplary embodiment.

FIG. 1 is a cross-sectional view illustrating a configuration of a nitride semiconductor device according to a first exemplary embodiment. A diode is herein discussed as an example of the nitride semiconductor device in this exemplary embodiment.

Diode 100 of this exemplary embodiment includes substrate 101, buffer layer 102, semiconductor layers 105 each constituted by undoped GaN layer 103 and undoped AlGaN layer 104, block layer 108 formed on undoped AlGaN layer 104a which is an uppermost layer of three laminated layers of semiconductor layers 105, cathode electrode 110, anode electrode 111.

More specifically, as illustrated in FIG. 1, diode 100 includes buffer layer 102 having a film thickness of 2 μm, undoped GaN layer 103 having a film thickness of 3 μm, and undoped AlGaN layer 104 having a film thickness of 25 nm in this order on substrate 101 constituted by Si, sapphire, SiC, GaN, or others. Laminated on undoped GaN layer 104 is semiconductor layer 105 constituted by undoped GaN layer 103 having a film thickness of 25 nm to 300 nm, and undoped AlGaN layer 104 having a film thickness of 25 nm. Further laminated on semiconductor layer 105 is uppermost semiconductor layer 105a constituted by undoped GaN layer 103 having a film thickness of 25 nm to 300 nm, and uppermost undoped AlGaN layer 104a having a film thickness of 25 nm. This structure of diode 100 produces a plurality of two-dimensional electron gas layers (channels) 106 each formed between undoped GaN layer 103 and undoped AlGaN layer 104.

Undoped AlGaN layer formed in the uppermost layer is also referred to as uppermost undoped AlGaN layer 104a, while a laminated body constituted by uppermost undoped AlGaN layer 104a and undoped GaN layer 103 immediately below this layer is also referred to as uppermost semiconductor layer 105a.

Block layer 108 is constituted by p-AlGaN (carrier concentration: 1E+18 $cm^{-3}$, i.e., $10^{18}$ $cm^{-3}$, for example) having a film thickness of 200 nm, and formed on uppermost undoped AlGaN layer 104a by dry etching or other methods. This p-AlGaN provides an effect of reducing interface leakage between a protection film formed on a device surface and uppermost undoped AlGaN layer 104a. Accordingly, block layer 108 thus formed allows reduction of leakage current produced in diode 100.

Undoped GaN layer 103 and undoped AlGaN layer 104 correspond to a first nitride semiconductor and a second nitride semiconductor, respectively, according to the present disclosure.

Cathode electrode (making ohmic contact with two-dimensional electron gas layer) 110 constituted by Ti/Al is configured to cover a recess region etched in such a shape as to penetrate the plurality of semiconductor layers 105 each constituted by undoped AlGaN layer 104 and undoped GaN layer 103. Cathode electrode 110 and anode electrode 111 are in contact with two-dimensional electron gas layers (channels) 106. This configuration of the recess region, formed in such a shape as to penetrate semiconductor layers 105 for formation of a cathode portion for cathode electrode 110, allows reduction of contact resistance between cathode electrode 110 and semiconductor layers 105. However, this recess region is not necessarily required. Anode electrode 111 is formed by a lift-off method in such a shape as to contact both uppermost undoped AlGaN layer 104a and block layer 108 constituted by p-AlGaN.

While block layer 108 is constituted by p-AlGaN in this example, similar effects are produced when block layer 108 is constituted by i-AlGaN, SiN, $SiO_2$, or other semiconductors. Anode electrode 111 and cathode electrode 110 correspond to a first electrode and a second electrode, respectively, according to the present disclosure.

Figure 6:
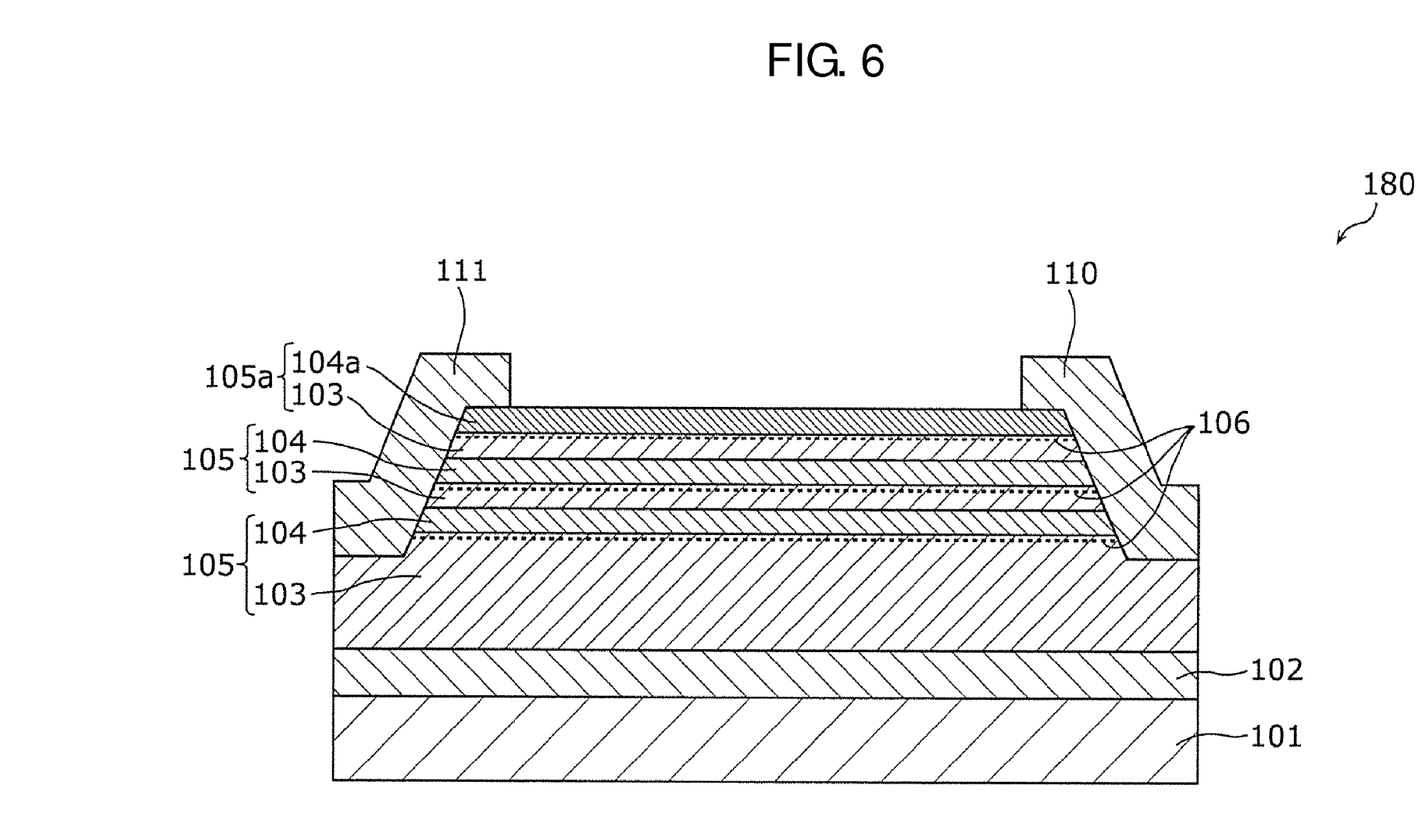
FIG. 6 is a cross-sectional view illustrating a configuration of a nitride semiconductor device according to a modification of the first exemplary embodiment.

Block layer 108 is effective in reduction of leakage in a diode, but may be eliminated as illustrated in FIG. 6 which will be touched upon later.

It is further preferable that Schottky metal constituting anode electrode 111 is configured to cover the region (recess region) etched to penetrate the plurality of semiconductor layers 105 each constituted by undoped AlGaN layer 104 and undoped GaN layer 103, and contact both two-dimensional electron gas layers (channels) 106 and p-AlGaN constituting block layer 108. This structure allows direct contact between Schottky metal and two-dimensional electrode gas layers (channels) 106 in comparison with a structure containing no recess region. Accordingly, forward characteristics improve. However, the recess region for forming anode electrode 111 is not necessarily required.

A manufacturing method of diode 100 is hereinafter described. FIGS. 2A through 2D are views illustrating manufacturing steps of diode 100 according to this exemplary embodiment.

Figure 2A:
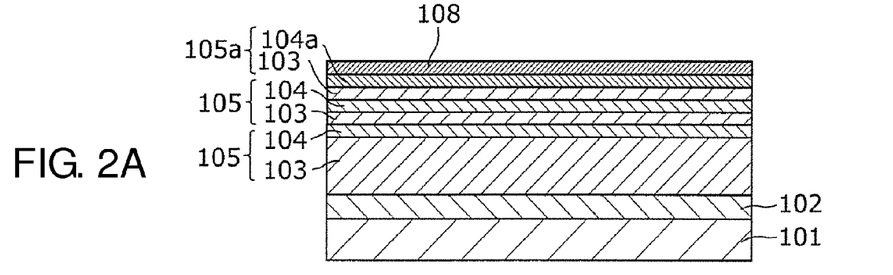
FIGS. 2A through 2D are views illustrating manufacturing steps of the nitride semiconductor device according to the first exemplary embodiment.

Initially, substrate 101 is prepared as illustrated in FIG. 2A. Substrate 101 is constituted by Si, sapphire, SiC, or GaN, for example. Buffer layer 102 having a film thickness of 2 μm is formed on substrate 101 by sputtering.

Undoped GaN layer 103 having a film thickness of 3 μm is formed on buffer layer 102 by sputtering. Subsequently, undoped AlGaN layer 104 having a film thickness of 25 nm is formed on undoped GaN layer 103 by sputtering. Then, the plurality of semiconductor layers 105 each constituted by undoped GaN layer 103 and undoped AlGaN layer 104 are sequentially laminated. A p-AlGaN layer, for example, as a layer constituting block layer 108, is further formed by sputtering on uppermost undoped AlGaN layer 104a constituting uppermost semiconductor layer 105a. Channel layer (two-dimensional electron gas layer) 106 is formed in each of semiconductor layers 105 in the vicinity of the interface between undoped GaN layer 103 and undoped AlGaN layer 104.

Figure 2B:
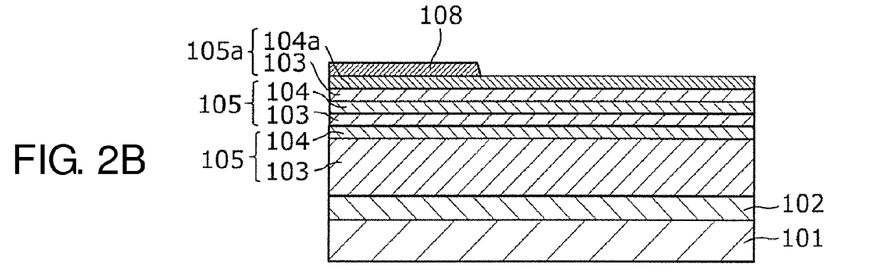
Figure 2C:
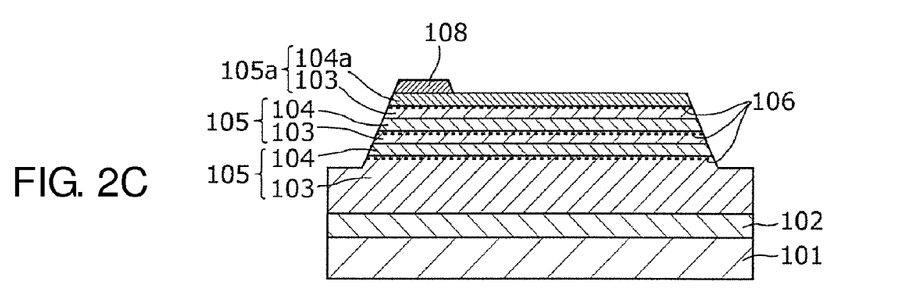

Then, as illustrated in FIG. 2B, a part of the p-AlGaN layer constituting block layer 108 is etched by dry etching to leave the p-AlGaN layer only in a first region where anode electrode 111 will be formed later. As illustrated in FIG. 2C, a recess region (excavated region) is formed by dry etching in each of a part of the first region where anode electrode 111 is to be formed, and a part of a second region where cathode electrode 110 is to be formed (a part of both ends of respective semiconductor layers 105 illustrated in FIG. 2C) in such a shape that the recess region penetrates all channels (two-dimensional electron gases) 106. In other words, formed by dry etching herein are the first region that continues from a side surface of the laminated body toward an upper surface of the laminated body, and the second region corresponding to a part of a region that is not the first region and continues from the side surface of the laminated body to the upper surface of the laminated body.

Figure 2D:
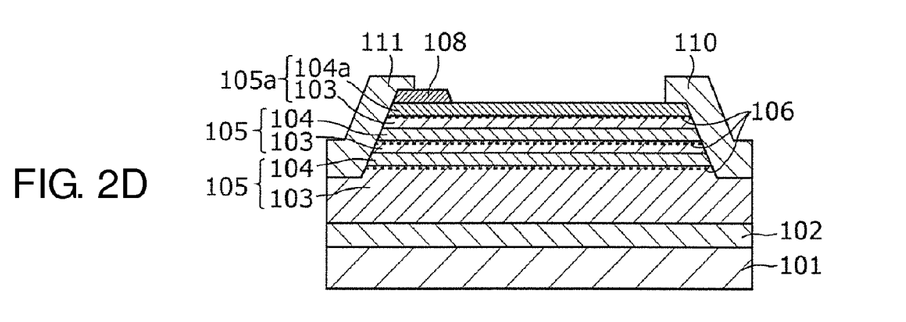

Subsequently, as illustrated in FIG. 2D, anode electrode 111 is formed in the first region. Anode electrode 111 is constituted by Ni (or other materials such as Pd and Pt) which constitutes a Schottky electrode, and formed by an evaporation method, for example, so as to cover a part of block layer 108 and an upper part of the recess region noted above. Cathode electrode 110 is constituted by Ti/Al which constitutes an ohmic electrode, and formed by an evaporation method, for example, in the second region corresponding to a region different from the first region of anode electrode 111 noted above, and formed on the side opposite to the first region so as to cover an upper part of the recess region. This step completes manufacture of diode 100.

Figure 3:
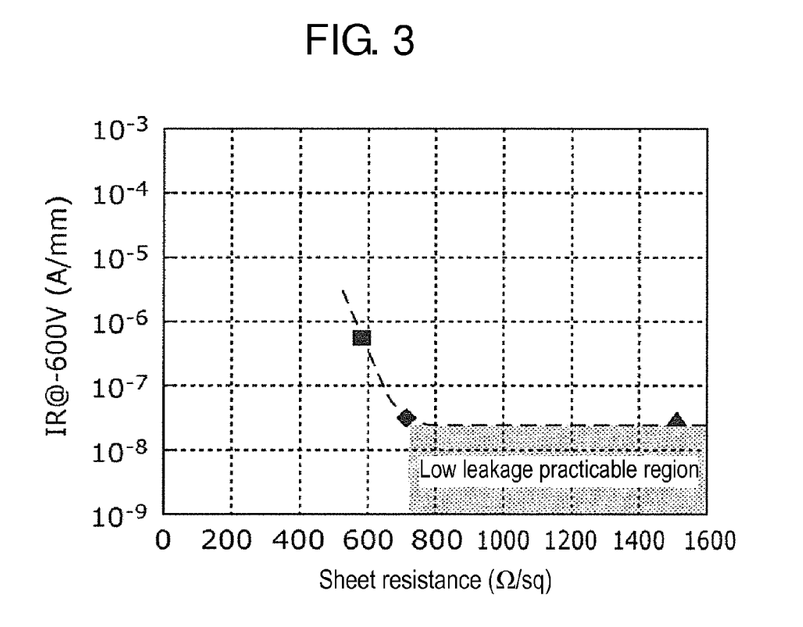
FIG. 3 is a graph showing a relationship between leakage current and surface side channel resistance.
Figure 4:
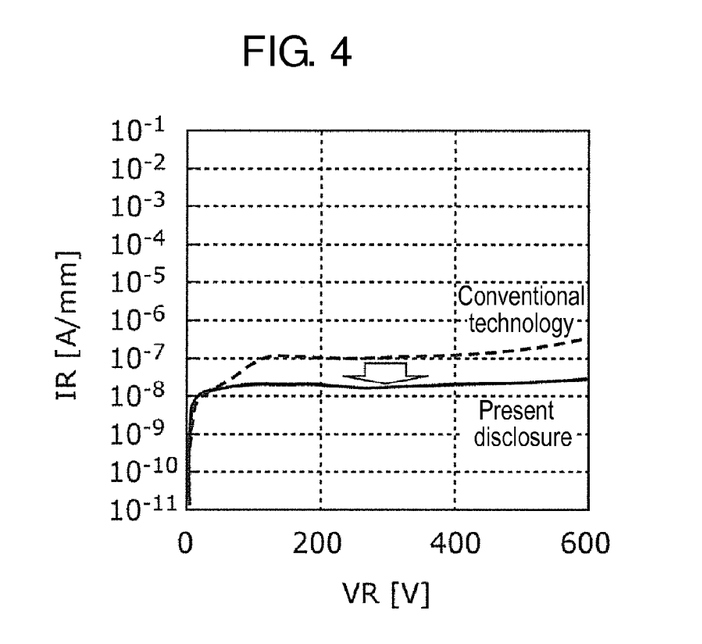
FIG. 4 is a graph showing a leakage current reduction effect.

The inventors of the present disclosure conducted leakage current analysis for a configuration of a multichannel diode thus constructed, and found that backward leakage current is strongly correlated with a carrier concentration of the uppermost layer side channel of the diode. FIG. 3 is a graph showing a relationship between leakage current and surface side channel resistance of the diode. FIG. 4 is a graph showing a leakage current reduction effect.

As illustrated in FIG. 3, leakage current decreases as sheet resistance of the diode increases. However, when sheet resistance exceeds approximately 700 Ω/sq, leakage current becomes a substantially constant value of $10^{-18}$ A/mm. This result indicates dominance of leakage current flowing from channel layer 106 in uppermost semiconductor layer 105a toward block layer 108 and anode electrode 111 in diode 100. Accordingly, backward leakage current decreases when the carrier concentration of channel layer 106 on uppermost semiconductor layer 105a side lowers.

This decrease in leakage current is achieved by the following mechanism. When the carrier concentration of channel layer 106 in uppermost semiconductor layer 105a lowers, a width of a depletion layer extending from the p-GaN layer constituting block layer 108 toward channel layer 106 increases. In this condition, since intensity of an electric field generated in this region lowers, leakage current decreases.

For lowering the carrier concentration of channel layer 106 in uppermost semiconductor layer 105a, Al composition of uppermost undoped AlGaN layer 104a is set to 20%, while each Al composition of undoped AlGaN layers 104 in the other region is set to 26%, for example. FIG. 4 shows characteristics of leakage current generated at these settings.

As can be seen from FIG. 4, decrease in on-resistance and increase in forward current are achievable by increasing Al composition not in the uppermost layer showing great contribution to leakage current, but in undoped AlGaN layers 104 other than the uppermost layer. It is preferable that the carrier concentration of the uppermost layer channel is set to a value lower than each carrier concentration of the channels other than the uppermost layer channel for realizing low on-resistance and low leakage current.

Also effective is such a structure which increases carrier concentrations of respective channel layers 106 as channel layers 106 are located lower.

According to diode 100 in this exemplary embodiment, channel layers 106 are formed at the respective interfaces between the plurality of semiconductor layers of a laminated body formed on the substrate. The carrier concentration of the channel in uppermost semiconductor layer 105a is lower than each carrier concentration of the other channels. This structure allows reduction of leakage current of diode 100.

Modification of First Embodiment

A modification according to the first exemplary embodiment is hereinafter described. A diode corresponding to a nitride semiconductor device according to this modification is different from diode 100 according to the first exemplary embodiment in that a film thickness of uppermost undoped AlGaN layer 104a is larger than each film thickness of other undoped AlGaN layers 104. Constituent elements in this modification similar to the corresponding constituent elements in the first exemplary embodiment have been given similar reference numbers.

Figure 5:
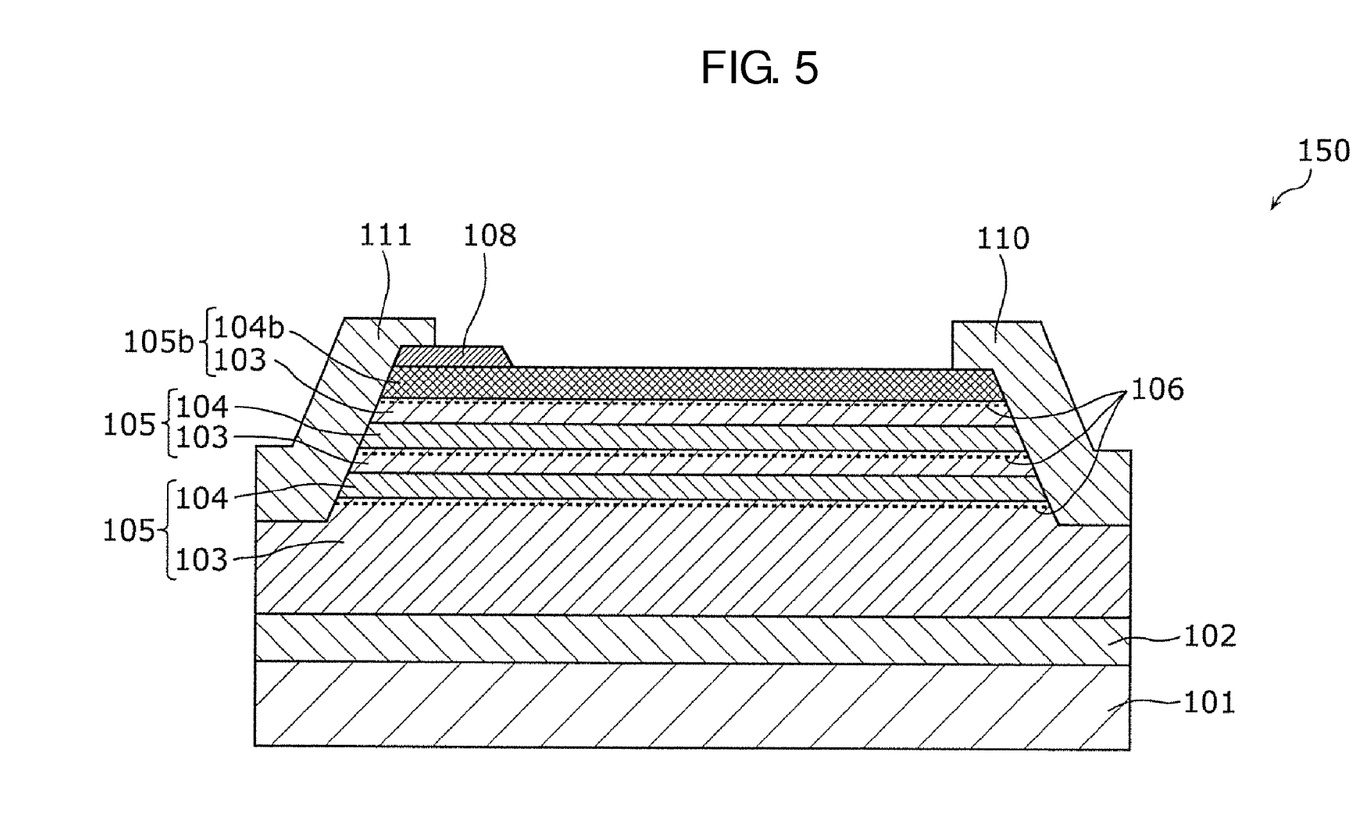
FIG. 5 is a cross-sectional view illustrating a configuration of a nitride semiconductor device according to a modification of the first exemplary embodiment.

FIGS. 5 and 6 are cross-sectional views illustrating configurations of diodes 150 and 180, respectively, according to this modification.

As illustrated in FIG. 5, uppermost undoped AlGaN layer 104b provided immediately below the p-AlGaN layer constituting block layer 108 has a large film thickness. The channel immediately below p-AlGaN layer has higher resistance in a state of forward bias in accordance with decrease in a carrier concentration of uppermost undoped AlGaN layer 104b as a result of band increasing effect by a p-layer.

The carrier concentration of channel layer 106 immediately below block layer 108 increases when uppermost undoped AlGaN layer 104b immediately below block layer 108 has a larger film thickness as illustrated in the figure. Accordingly, this structure reduces resistance of uppermost undoped AlGaN layer 104b, thereby decreasing leakage current of diode 150.

Block layer 108 is effective in reduction of leakage in diodes 100 and 150 as noted herein, but not necessarily required as in the configuration of diode 180 illustrated in FIG. 6.

It is preferable that material of anode electrode 111 forming Schottky metal contains at least one of Ni, Pd, Au, and Ti. The term "undoped" herein refers to such a state that no impurities are intentionally introduced. According to diode 150 corresponding to the nitride semiconductor device in this modification, uppermost undoped AlGaN layer 104b may be constituted by undoped $Al_{0.25}Ga_{0.75}N$, for example.

According to this modification, three-channel diode 150, i.e., an example of a diode containing three laminated semiconductor layers 105 has been discussed. However, effects similar to the effects of the diode according to this modification are provided when a diode contains a larger number of channels.

The diode thus constructed allows reduction of backward leakage current without deteriorating forward characteristics of the diode. Accordingly, the diode provided herein is an excellent nitride semiconductor diode capable of reducing on-resistance and backward leakage.

Second Exemplary Embodiment

A second exemplary embodiment is now described. Discussed in this exemplary embodiment is a transistor as an example of a nitride semiconductor device.

Figure 7:
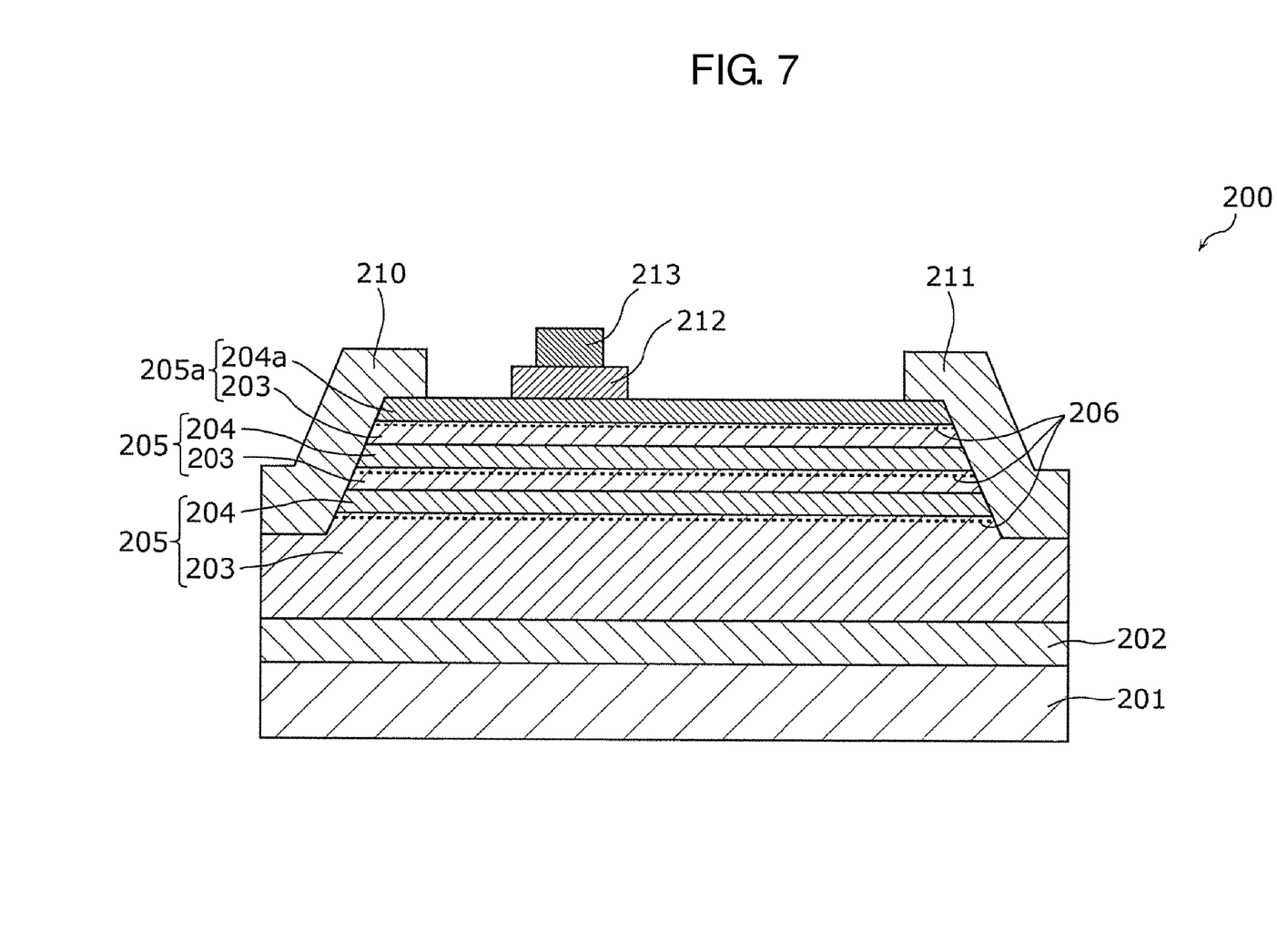
FIG. 7 is a cross-sectional view illustrating a configuration of a nitride semiconductor device according to a second exemplary embodiment.

FIG. 7 is a cross-sectional view illustrating a configuration of a nitride semiconductor device according to this exemplary embodiment.

As illustrated in FIG. 7, transistor 200 according to this exemplary embodiment includes buffer layer 202 having a film thickness of 2 µm, undoped GaN layer 203 having a film thickness of 3 µm, and undoped AlGaN layer 204 having a film thickness of 25 nm in this order on substrate 201 constituted by Si, sapphire, SiC, GaN or others. Laminated on undoped AlGaN layer 204 is a laminated body constituted by undoped GaN layer 203 having a film thickness of 5 nm to 300 nm, and undoped AlGaN layer 204 having a film thickness of 25 nm. Further laminated on the laminated body is uppermost semiconductor layer 205a constituted by undoped GaN layer 203 having a film thickness of 25 nm to 300 nm, and undoped AlGaN layer 204a having a film thickness of 25 nm. This structure of transistor 200 produces a plurality of two-dimensional electron gas layers (channels) 206 each formed between undoped GaN layer 203 and undoped AlGaN layer 204.

Undoped AlGaN layer 204a formed on the uppermost layer is also referred to as uppermost undoped AlGaN layer 204a, and the laminated body constituted by uppermost undoped AlGaN layer 204a and undoped GaN layer 203 immediately below layer 204a is also referred to as uppermost semiconductor layer 205a.

Undoped GaN layer 203 and undoped AlGaN layer 204 correspond to the first nitride semiconductor and the second nitride semiconductor, respectively, according to the present disclosure.

Source electrode 210, drain electrode 211, and gate electrode 213 are further formed on uppermost semiconductor layer 205a.

Each of source electrode 210 and drain electrode 211 each constituted by Ti/Al (making ohmic contact with two-dimensional electron gas layer) is configured to cover a recess region etched in such a shape as to penetrate semiconductor layers 205 each constituted by undoped AlGaN layer 204 and undoped GaN layer 203. Source electrode 210 and drain electrode 211 are in contact with two-dimensional electron gas layers (channels) 206. The configuration of the recess regions penetrating semiconductor layers 205 as a first region and a third region where drain electrode 211 and source electrode 210 are formed, respectively, reduces contact resistance between semiconductor layers 205 and the two electrodes of source electrode 210 and drain electrode 211. However, formation of the recess regions is not necessarily required.

Block layer 212 constituted by p-AlGaN (carrier concentration: 1E+18 cm$^{-3}$, i.e., $10^{18}$ cm$^{-3}$, for example) having a film thickness of 200 nm is formed on uppermost undoped AlGaN layer 204a by dry etching or other methods. Gate electrode 213 is formed on block layer 212 by a lift-off method. This p-AlGaN provides an effect of reducing interface leakage between a protection film formed on a device surface and uppermost undoped AlGaN layer 204a. Accordingly, reduction of leakage current produced in transistor 200 is achievable.

Figure 8:
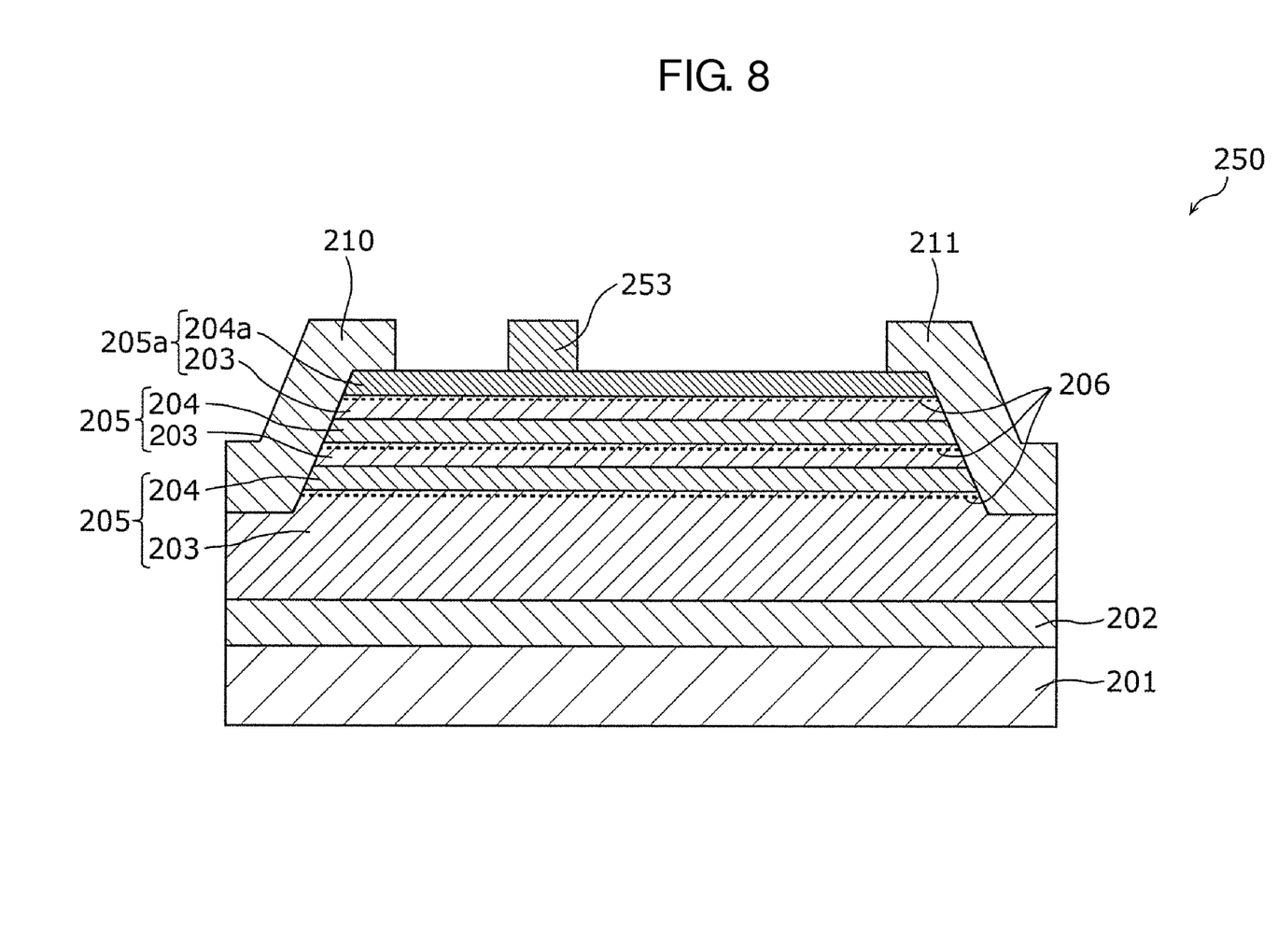
FIG. 8 is a cross-sectional view illustrating a configuration of a nitride semiconductor device according to the second exemplary embodiment.

While block layer 212 is constituted by p-AlGaN in this example, similar effects are produced when block layer 212 is constituted by i-AlGaN, SiN, SiO$_2$, or other semiconductors. Block layer 212 is effective in reduction of leakage, but is not required to be formed. More specifically, as in a structure of transistor 250 illustrated in FIG. 8, gate electrode 253 may be directly formed on uppermost undoped AlGaN 204a without formation of a block layer.

According to transistor 200 in this exemplary embodiment, channel layers 206 are formed at the respective interfaces between the plurality of semiconductor layers of the laminated body laminated on the substrate. A carrier concentration of the channel layer in uppermost semiconductor layer 205a is lower than each carrier concentration of the other channel layers. This structure allows reduction of leakage current in transistor 200.

Modification of Second Exemplary Embodiment

A modification of the second exemplary embodiment is hereinafter described. A transistor corresponding to a nitride semiconductor device according to this modification is different from transistor 200 according to the second exemplary embodiment in that a gate recess is formed below a gate electrode.

Figure 9:
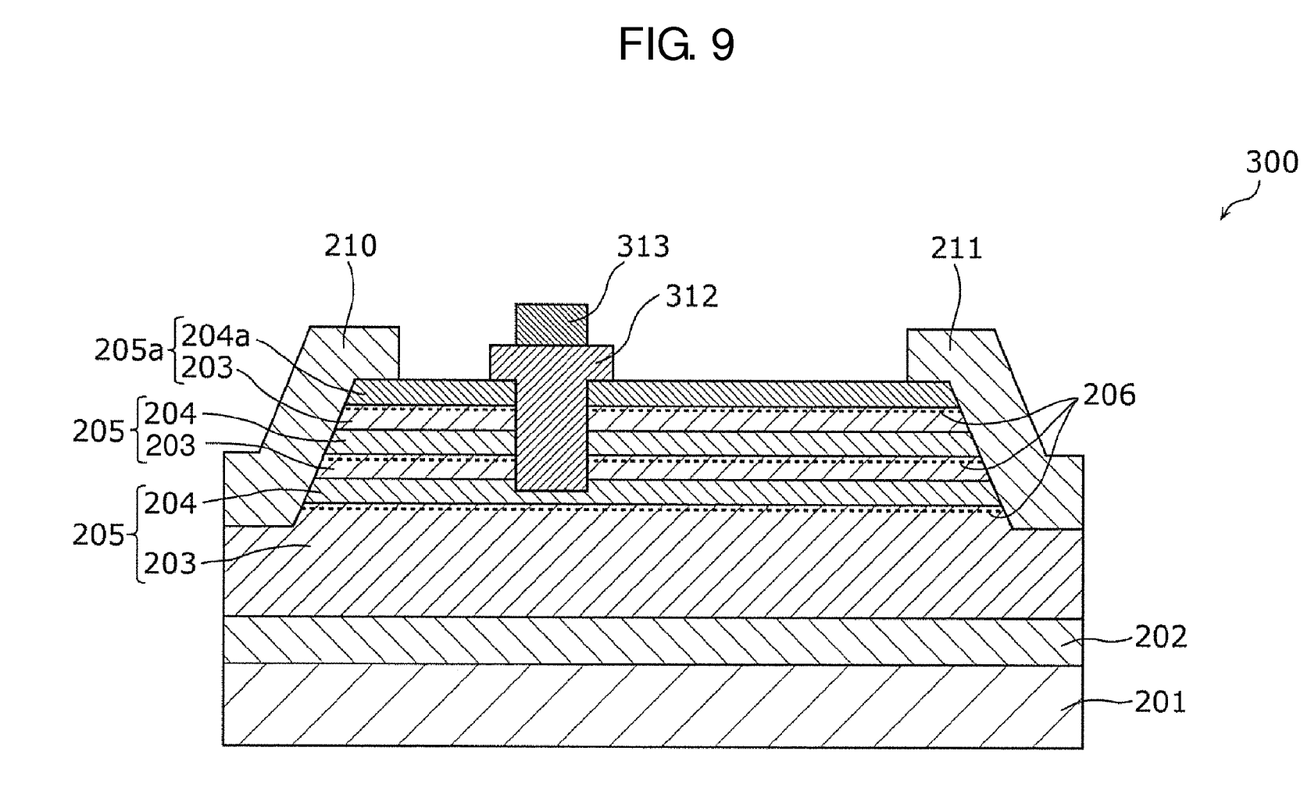
FIG. 9 is a cross-sectional view illustrating a configuration of a nitride semiconductor device according to a modification of the second exemplary embodiment.

FIG. 9 is a cross-sectional view illustrating a configuration of the transistor according to this modification.

As illustrated in FIG. 9, block layer 312 of transistor 300 is configured to cover a recess region (gate recess) etched in such a shape as to penetrate semiconductor layer 205 constituted by undoped AlGaN layer 204 and undoped GaN layer 203. This structure allows easier control over a threshold of transistor 300 in comparison with a structure including no gate recess.

More specifically, in manufacturing normally-off operation type transistor 300, for example, a gate recess to be formed is configured to reach a lowermost AlGaN barrier layer, i.e., undoped AlGaN layer 204 constituting lowermost semiconductor layer 205. Alternatively, the gate recess may be configured to penetrate undoped AlGaN layer 204 constituting lowermost semiconductor layer 205, and then undoped AlGaN layer 204 may be again formed by a regrowth method. Gate recess 310 discussed herein is not necessarily required.

A manufacturing method of transistor 300 is now described. FIGS. 10A through 10F are views illustrating manufacturing steps of transistor 300 according to this modification.

Figure 10A:
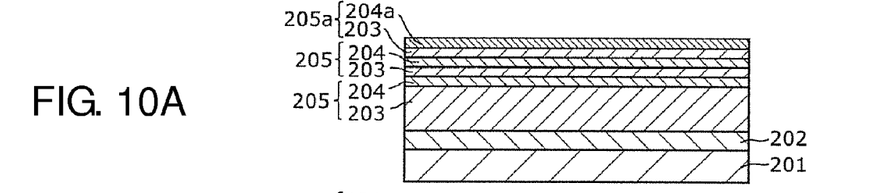
FIGS. 10A through 10F are views illustrating manufacturing steps of the nitride semiconductor device according to the modification of the second exemplary embodiment.

As illustrated in FIG. 10A, buffer layer 202 is formed on substrate 201 constituted by Si. A plurality of semiconductor layers 205 each constituted by undoped GaN layer 203 and undoped AlGaN layer 204 are laminated on buffer layer 202. Channel layer (two-dimensional electron gas layer) 206 is formed in each of semiconductor layers 205 each constituted by undoped GaN layer 203 and undoped AlGaN layer 204. The manufacturing method of transistor 300 illustrated in FIG. 10A is similar to the manufacturing method of diode 100 described in the first exemplary embodiment. Accordingly, this manufacturing method is not detailed herein.

Figure 10B:
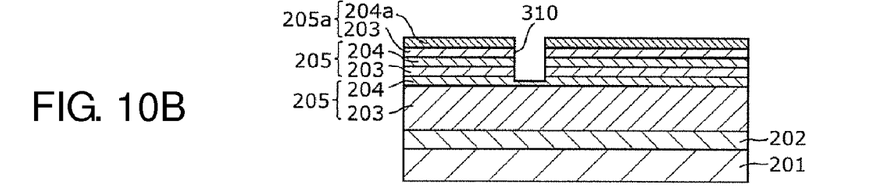
Figure 10C:
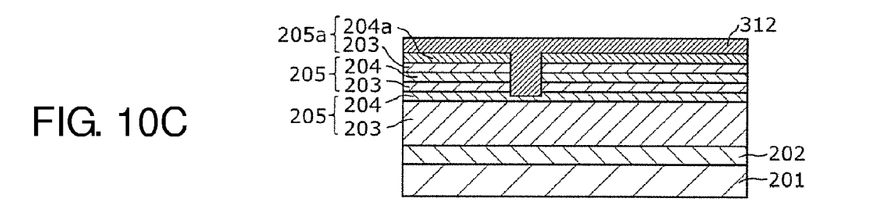

As illustrated in FIG. 10B, gate recess (excavated portion) 310 is formed by dry etching as a recess extending from uppermost undoped AlGaN layer 204a to undoped AlGaN layer 204 constituting lowermost semiconductor layer 205. As illustrated in FIG. 10C, a p-AlGaN layer constituting block layer 312 is allowed to grow in such a shape as to cover an inside of gate recess 310 and an upper surface of undoped AlGaN layer 204a.

Figure 10D:
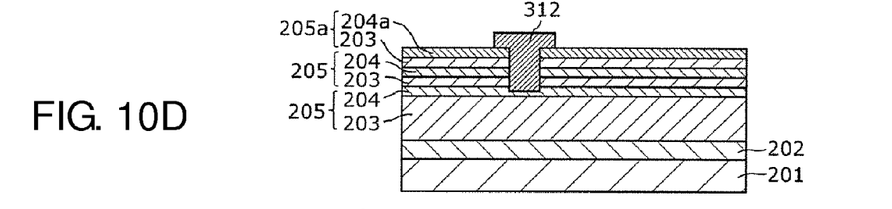

As illustrated in FIG. 10D, a part of the p-AlGaN layer is etched by dry etching. In this case, the p-AlGaN layer is etched such that a remaining part of the p-AlGaN layer can cover gate recess 310. This step completes formation of block layer 312.

Figure 10E:
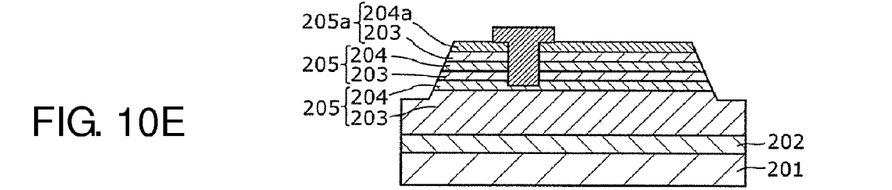

As illustrated in FIG. 10E, recess regions (excavated regions) corresponding to the first region and the third region are formed by dry etching on the drain electrode side and the source electrode side, respectively, in such shapes as to penetrate all channel layers 206.

Figure 10F:
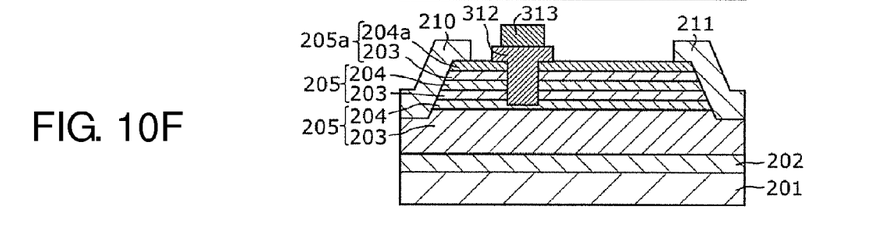

As illustrated in FIG. 10F, drain electrode 211 and source electrode 210 are formed in the first region and the third region, respectively. Drain electrode 211 and source electrode 210 are constituted by Ti/Al constituting an ohmic electrode for each, and formed by an evaporation method or other methods in such shapes as to cover upper parts of the recess regions formed in the first region and the third region. In addition, a Ni (or other materials such as Pd and Pt) layer constituting gate electrode 313 is formed by an evaporating method or other methods on block layer 312 constituted by the p-AlGaN layer. This step completes formation of transistor 300.

The inventors of the present disclosure conducted leakage current analysis for a configuration of a multichannel transistor thus constructed, and found that backward leakage current is strongly correlated with a carrier concentration of an uppermost layer side channel of the transistor. This result indicates dominance of leakage current flowing from the channel in the uppermost layer toward the block layer and a gate metal. Accordingly, backward leakage current decreases when the carrier concentration of the uppermost layer side channel lowers. This decrease in leakage current is achieved by the following mechanism. When the carrier concentration of channel layer 206 in uppermost semiconductor layer 205a lowers, a width of a depletion layer extending from the p-GaN layer constituting block layer 312 toward channel layer 206 increases. In this condition, since intensity of an electric field generated in this region lowers, leakage current decreases.

For lowering the carrier concentration of channel layer 206 in uppermost semiconductor layer 205a, Al composition of uppermost undoped AlGaN layer 204a is set to 20%, while each Al composition of undoped AlGaN layers 204 in the other region is set to 26%, for example.

Decrease in on-resistance and increase in forward current are achievable by increasing Al composition not in the uppermost layer showing great contribution to leakage current, but in undoped AlGaN layers 204 other than the uppermost layer. It is preferable that the carrier concentration of the uppermost layer channel is set to a value lower than each carrier concentration of the channels other than the uppermost layer channel for realizing low on-resistance and low leakage current.

Also effective is such a structure which increases carrier concentrations of respective channel layers 206 as channel layers 206 are located lower.

Also allowed is such a structure which increases a film thickness of uppermost undoped AlGaN layer 204a provided immediately below the p-AlGaN layer constituting block layer 312. In an on-state, the channel immediately below the p-AlGaN layer has a lower carrier concentration as a result of band increasing effect by a p-layer. In this case, resistance of this channel increases. However, the carrier concentration of the channel immediately below the p-AlGaN layer increases when uppermost undoped AlGaN layer 204a immediately below the p-AlGaN layer has a larger film thickness. Accordingly, reduction of resistance of transistor 300 is achievable.

According to transistor 300 in the modification of this exemplary embodiment, off-state leakage current decreases without deterioration of on-state characteristics. Accordingly, the transistor provided herein is an excellent nitride semiconductor transistor capable of reducing on-resistance and leakage current.

Figure 11:
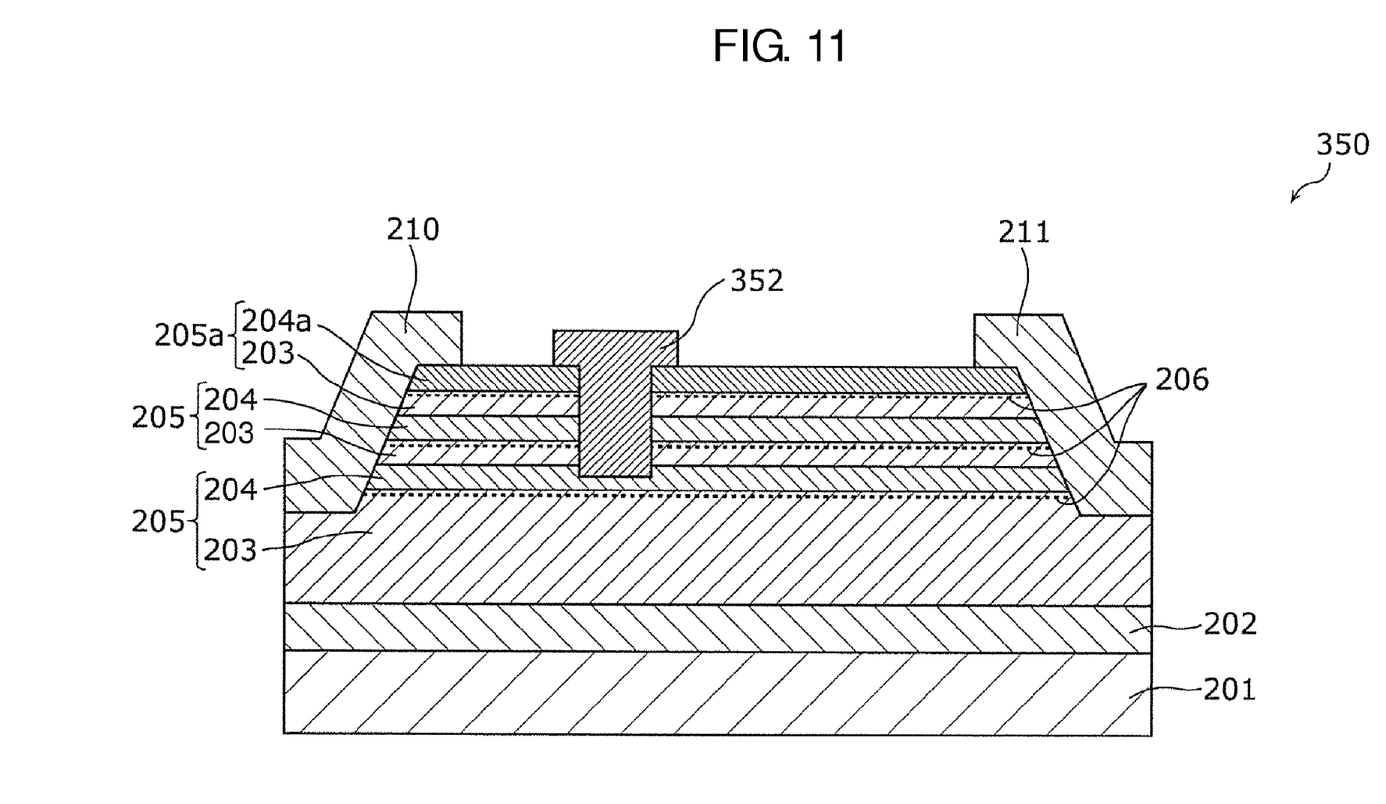
FIG. 11 is a cross-sectional view illustrating a configuration of a nitride semiconductor device according to a modification of the second exemplary embodiment.

The transistor discussed herein may have a configuration not including block layer 312 between gate recess 310 and gate electrode 313. FIG. 11 is a cross-sectional view illustrating a configuration of a transistor according to this exemplary embodiment, showing an example not including a block layer. As illustrated in FIG. 11, transistor 350 may include a Ni (or other materials such as Pd and Pt) layer constituting gate electrode 352, and formed by an evaporation method or other methods in such a shape as to cover gate recess 310 and an inside of gate recess 310.

While the nitride semiconductor devices according to the respective exemplary embodiments and modifications of the present disclosure have been described herein, the present disclosure is not limited to these exemplary embodiments and modifications. The present disclosure includes, within a range of the scope of the present disclosure, modes including various modifications made by those skilled in the art in the light of teachings disclosed in the respective exemplary embodiments and modifications, and modes containing arbitrary combinations of constituent elements shown in the respective exemplary embodiments and modifications.

A nitride semiconductor device according to the present disclosure is a useful device applicable to a power device included in a power supply circuit of a television set or other consumer products.

What is claimed is:

1. A nitride semiconductor device comprising:
a substrate;
a buffer layer formed on the substrate;
a laminated body formed by two or more cycles of semiconductor layers each including a first nitride semiconductor layer and a second nitride semiconductor layer having a larger band gap than a band gap of the first nitride semiconductor layer, the first and second nitride semiconductor layers being laminated in this order on the buffer layer;
a first electrode formed in a first region that continues from a side surface of the laminated body to an upper surface of the laminated body; and
a second electrode formed in a second region that is a part of a region continuing from the side surface of the laminated body to the upper surface of the laminated body but is not the first region, wherein:
a channel layer is formed in each of the semiconductor layers at an interface between the first nitride semiconductor layer and the second nitride semiconductor layer,
a carrier concentration of the channel layer in an uppermost of the semiconductor layers is lower than a carrier concentration of each of the channel layers of the other semiconductor layers,
the first nitride semiconductor layer is constituted of GaN,
the second nitride semiconductor layers are constituted of AlGaN,
an Al composition ratio of AlGaN constituting an uppermost layer of the second nitride semiconductor layers is lower than each Al composition ratio of AlGaN constituting the other second nitride semiconductor layers, and
a number of the second nitride semiconductor layers is three or more.

2. The nitride semiconductor device according to claim 1, further comprising a block layer electrically connected with the first electrode, and formed between the first electrode and the upper surface of the laminated body.

3. The nitride semiconductor device according to claim 2, wherein the block layer is constituted of p-AlGaN.

4. The nitride semiconductor device according to claim 1, wherein a film thickness of the uppermost layer of the second nitride semiconductor layer is larger than each film thickness of the other second nitride semiconductor layers.

5. The nitride semiconductor device according to claim 1, wherein:
the nitride semiconductor device is a nitride semiconductor diode,
the first electrode is an anode electrode, and
the second electrode is a cathode electrode.

6. The nitride semiconductor device according to claim 1, wherein:
the nitride semiconductor device is a nitride semiconductor transistor,
the first electrode is a drain electrode,
the nitride semiconductor transistor further includes a third electrode disposed on an upper surface of an uppermost layer of the laminated body, and
the third electrode is a source electrode.

7. The nitride semiconductor device according to claim 2, wherein a thickness of the second nitride semiconductor layer of the uppermost of the semiconductor layer under the block layer is the same as the thickness at the center of the second nitride semiconductor layer of the uppermost of the semiconductor layer.

8. The nitride semiconductor device according to claim 1, wherein an entirety of the second nitride semiconductor layer of the uppermost of the semiconductor layer has a substantially same thickness.

9. The nitride semiconductor device according to claim 1, wherein a film thickness, at a center of the uppermost of the second nitride semiconductor layers, of the uppermost of the semiconductor layer is larger than a film thickness at a center of the other second nitride semiconductor layers.

* * * * *